United States Patent [19]
Komatsu

[11] Patent Number: 5,930,195
[45] Date of Patent: Jul. 27, 1999

[54] SEMICONDUCTOR MEMORY DEVICE

[75] Inventor: Koji Komatsu, Nara, Japan

[73] Assignee: Sharp Kabushiki Kaisha, Osaka, Japan

[21] Appl. No.: 09/179,105

[22] Filed: Oct. 26, 1998

[30] Foreign Application Priority Data

Oct. 31, 1997 [JP] Japan .................................. 9-301058

[51] Int. Cl.$^6$ .................................................. G11C 13/00
[52] U.S. Cl. .................... 365/230.03; 365/230.08
[58] Field of Search ..................... 365/189.02, 230.03, 365/230.08

[56] References Cited

U.S. PATENT DOCUMENTS 5,499,216   3/1996   Yamamoto ......................... 365/230.03

FOREIGN PATENT DOCUMENTS

06104406   4/1994   Japan .

Primary Examiner—Terrell W. Fears
Attorney, Agent, or Firm—Morrison & Foerster, LLP

[57] ABSTRACT

A semiconductor memory device includes a plurality of main bit lines; a first bank having a plurality of memory cells, a plurality of word lines and a plurality of sub-bit lines; a second bank having a plurality of memory cells, a plurality of word lines and a plurality of sub-bit lines; an auxiliary conductive region connected to one of the plurality of main bit lines, the auxiliary conductive region being shared by the first bank and the second bank; a first bank selection transistor for selectively connecting one of the plurality of sub-bit lines of the first bank to the auxiliary conductive region; a second bank selection transistor for selectively connecting one of the plurality of sub-bit lines of the second bank to the auxiliary conductive region; and a first bank selection line shared by the first bank selection transistor and the second bank selection transistor.

7 Claims, 7 Drawing Sheets

SEMICONDUCTOR MEMORY DEVICE

BACKGROUND OF THE INVENTION

1. Field of the Invention

The present invention relates to a semiconductor memory device employing a hierarchical bit-line structure in which main bit lines are formed above sub-bit lines. More particularly, the present invention relates to a memory cell array configuration of mask ROM (read only memory) and EEPROM (electrically erasable programmable read only memory) which employ a hierarchical bit-line structure.

2. Description of the Related Art

As a conventional example of non-volatile memories such as flash EEPROM and mask ROM (hereinafter, collectively referred to as ROM), there is Japanese Laid-open Publication No. 6-104406, which is assigned to the same assignee as the instant application. Japanese Laid-open Publication No. 6-104406 has proposed a RAM employing a hierarchical bit-line structure.

Figure 5:
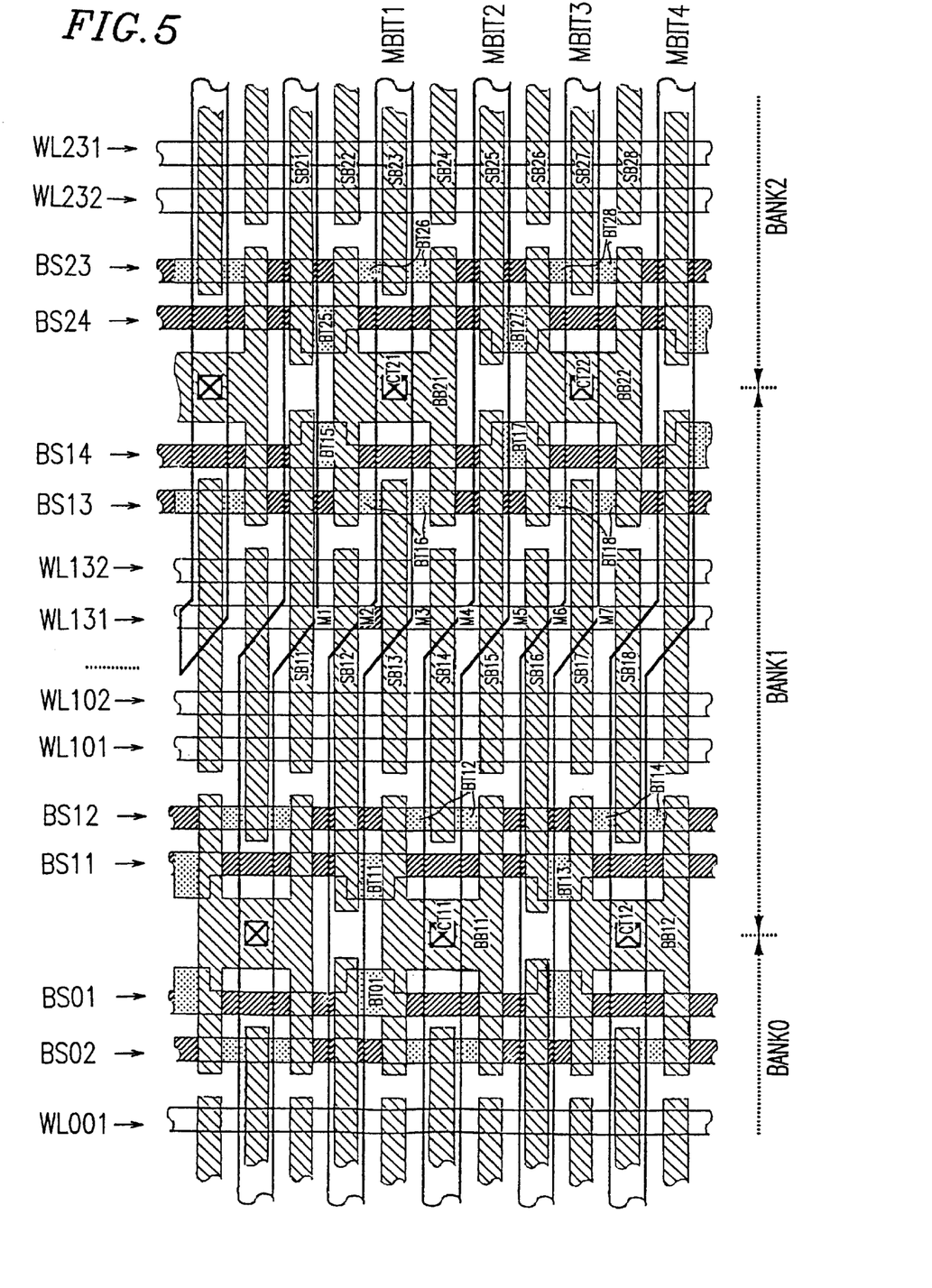
FIG. 5 is a diagram showing a partial layout pattern of a conventional ROM employing a hierarchical bit-line structure.
Figure 6:
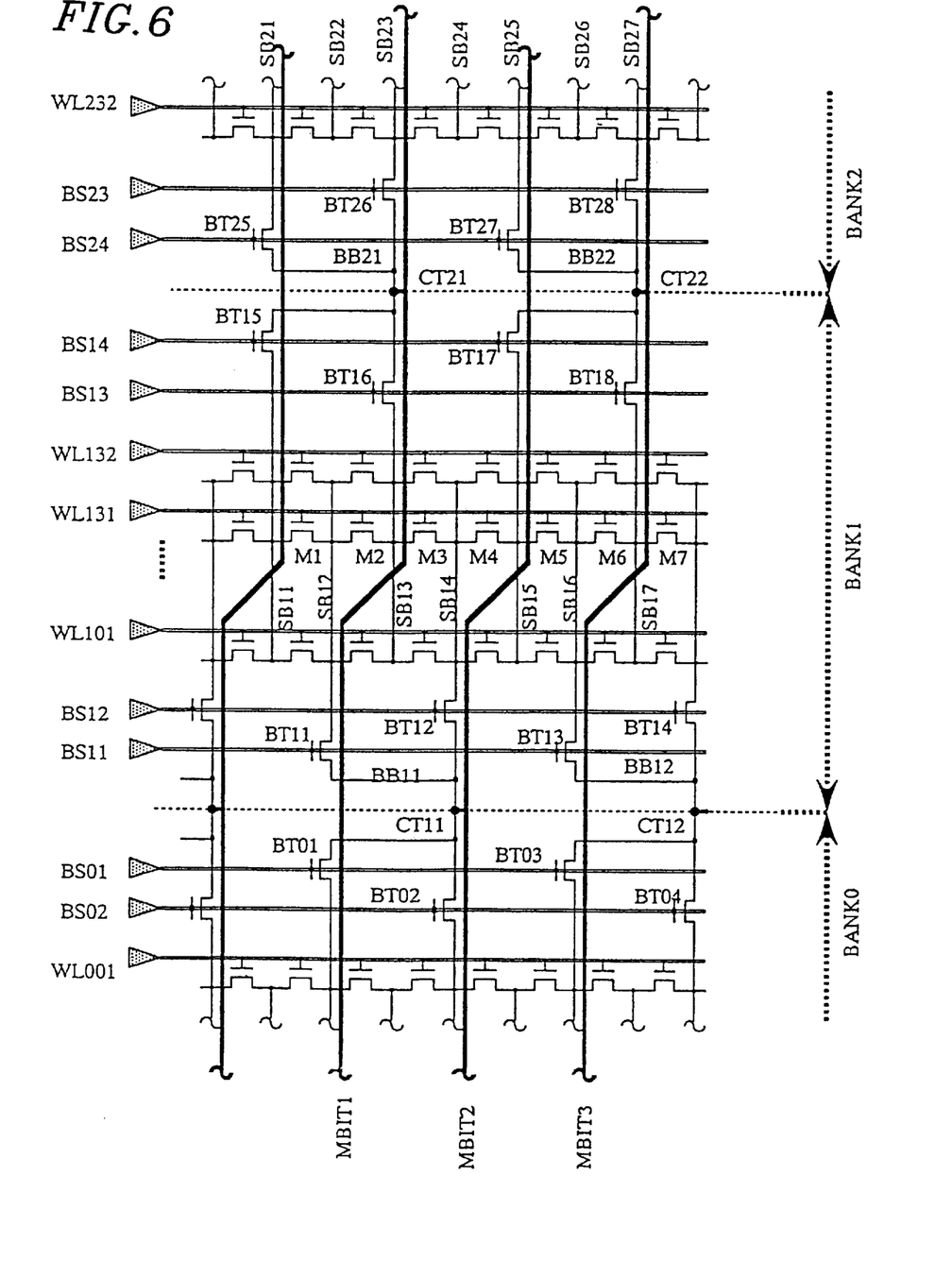
FIG. 6 is a diagram showing an equivalent circuit of the ROM of FIG. 5.

This conventional ROM will now be described in terms of its configuration with reference to FIGS. 5 and 6. FIG. 5 shows a partial layout pattern of the ROM, and FIG. 6 shows an equivalent circuit thereof.

A plurality of sub-bit lines Sb11, SB12, . . . are provided in the column direction on a semiconductor substrate. The plurality of sub-bit lines are formed from a diffusion layer of a conductivity type which is opposite to a conductivity type of the semiconductor substrate. Moreover, a plurality of word lines WL001, WL101, WL102, . . . are provided in the row direction so as to intersect the plurality of sub-bit lines extend. The plurality of word lines are formed from polysilicon.

A memory cell transistor (hereinafter, simply referred to as a memory cell) such as M1 to M7 is provided between every adjacent two sub-bit lines. For example, the memory cell M1 is provided between the sub-bit lines SB11 and SB12. The word lines serve as the gate electrodes of the corresponding memory cells. Thus, the memory cells are arranged in a matrix on a prescribed region of the semiconductor substrate.

Auxiliary conductive regions BB11, BB12, . . . , BB21, BB22, . . . are formed in the vicinity of the ends of the corresponding sub-bit lines. For example, the auxiliary conductive region BB21 is formed in the vicinity of the ends of the sub-bit line SB11 to SB15 and SB21 to SB25. Each auxiliary conductive region thus formed is of the same conductivity type as that of the sub-bit lines. It should be noted that, in this specification, the term "conductive" means "electrically conductive" unless otherwise mentioned.

Moreover, bank selection transistors (hereinafter, referred to as bank cells) such as BT01 to BT27 are formed in a region between two sub-bit lines which are adjacent to an auxiliary conductive region. For example, bank cells BT11 and BT12 are respectively formed between the sub-bit line SB12 and the auxiliary conductive region BB11, and between the sub-bit line SB14 and the auxiliary conductive region BB11. The sub-bit lines SB12 and SB14 are adjacent to the auxiliary conductive region BB11. A plurality of bank selection lines such as BS01 to BS24 are formed in the row direction, and the bank selection lines serve as the gate electrodes of the corresponding bank cells. The plurality of bank selection lines are formed from polysilicon.

A plurality of main bit lines MBIT1, MBIT2, MBIT3, MBIT4, . . . are provided in the column direction as metal interconnections. Each of the auxiliary conductive regions is connected to a corresponding main bit line through a corresponding contact (such as CT11 to CT22). A set of sub-bit lines extending in parallel to each other and auxiliary conductive regions connected to the sub-bit lines is hereinafter referred to as a bank (such as BANK0, BANK1 and BANK2).

In the above-mentioned conventional ROM, four bank selection lines are required per bank. More specifically, as shown in FIG. 6, the bank cells BT12, BT14, . . . are connected to the bank selection line BS12, whereas the bank cells BT11, BT13, . . . are connected to the bank selection line BS11.

Hereinafter, an operation of the above-mentioned conventional ROM will be described, assuming that the semiconductor substrate is of a $P^-$-type, and the sub-bit lines and the auxiliary conductive regions are of an $N^+$-type.

First, when potentials at a bank selection line and a word line are set to a high level, a bank cell and a memory cell are selected. The gate electrode of each bank cell is formed from a part of a corresponding bank selection line, whereas the gate electrode of each memory cell is formed from a part of a corresponding word line.

A threshold of a memory cell can be set by the amount of boron ions implanted into its channel region which is formed under the gate electrode. In other words, a memory cell which has been subjected to the ion implantation has a higher threshold voltage. Therefore, when the amount of ion implantation is set to a prescribed value, a memory cell which has been subjected to the ion implantation remains in an OFF state even when the gate potential attains a high level (i.e., OFF-cell). In this case, a memory cell which has not been subjected to the ion implantation is turned on in response to the high level of the gate electrode (i.e., ON-cell).

It should be noted that, by the above-mentioned ion implantation, a portion of each bank selection line which does not constitute the bank cells is set to be in an OFF state.

A memory cell in a bank (such as BANK1) is selected by a row selection circuit (not shown). More specifically, the row selection circuit selects the word line and sub-bit lines by setting the word line and the bank selection lines which are connected to the sub-bit lines to a high level. Thus, the memory cell is selected, and data is read from the memory cell thus selected.

For example, data in the memory cell M2 is read as follows: the memory cell M2 in the bank BANK1 is selected by selecting the word line WL131 (i.e., the gate electrode) and the sub-bit lines SB12 and SB13 (i.e., the source and drain) by the row selection circuit. At this time, the row selection circuit selects the word line WL131 and the sub-bit lines SB12 and SB13 by setting to a high level the word line WL131 and the bank selection lines BS11 and BS13, which are connected to the sub-bit lines SB12 and SB13, while setting the other word lines and bank selection lines to a low level. As a result, the bank cells BT11 and BT16 are selected, whereby the memory cell M2 is selected. The sub-bit lines SB12 and SB13 are connected to the auxiliary conductive regions BB11 and BB21 through the bank cells BT11 and BT16, and thus, are connected to the main bit lines MBIT1 and MBIT2 through the contacts CT11 and CT21, respectively. The main bit lines MBIT1 and MBIT2 are selectively connected to respective data lines by a column selection circuit (not shown). Data in the memory cell M2 is read through this data path.

According to the above-mentioned conventional ROM, the plurality of banks BANK1, BANK2, . . . are successively arranged in the column direction with a common auxiliary conductive region therebetween. Moreover, the plurality of sub-bit lines are successively arranged in, the row direction. Thus, the memory cell array is formed.

In each bank, two sub-bit lines are connected to a single main bit line through the corresponding bank cells. In other words, two sub-bit lines are provided per main bit line in each bank. Each pair of sub-bit lines are connected through the corresponding bank cells to the corresponding main bit line on the opposite sides of the bank. More specifically, referring to FIG. 6, the sub-bit line SB12 is connected through the bank cell BT11 to the main bit line MBIT1 on the left side of the bank BANK1, whereas the sub-bit line SB13 is connected through the bank cell BT16 to the main bit line MBIT1 on the right side of the bank BANK1. These two main bit lines are connected to respective data lines through the column selection circuit, wherein one of the data lines is connected to a low potential, whereas the other data line is connected to a high potential. Accordingly, an ON/OFF state of the memory cell of interest can be read by detecting the difference in current between the data lines.

The above-mentioned conventional ROM has a hierarchical bit-line structure. Therefore, among a plurality of sub-bit lines connected to a single main bit line, sub-bit lines other than those associated with a memory cell to be accessed are electrically disconnected from the main bit line by the corresponding bank cells. As a result, a load imposed on the main bit line is reduced, whereby the access speed can be increased.

According to the above-mentioned conventional ROM having a hierarchical bit-line structure, a single main bit line is provided for every two sub-bit lines.

In general, in the upper layers of the semiconductor device, dense interconnections are less likely to be produced, due to the difference in level produced in the semiconductor substrate during the production process. The main bit lines are metal interconnections which are formed of a layer located higher than a buried diffusion layer forming the sub-bit lines. Therefore, the main bit lines is subject to a strict design rule.

Moreover, in order to reduce a resistance of the main bit lines, a width of the main bit lines must be increased.

Furthermore, a selection transistor which constitutes a column selection circuit for selecting one of the main bit lines must be provided on a main bit-line by main bit-line basis. Therefore, the area of the column selection circuit is increased according to an increase in the number of the main bit lines, whereby reduction in size of the ROM is limited.

In order to solve such problems as described above, the number of sub-bit lines connected to a single main bit line may be increased. In this case, the number of main bit lines can be reduced, whereby the design rule for the main bit lines becomes less strict. Therefore, a width of the main bit lines can be increased, while preventing an increase in the area of the column selection circuit.

Figure 7:
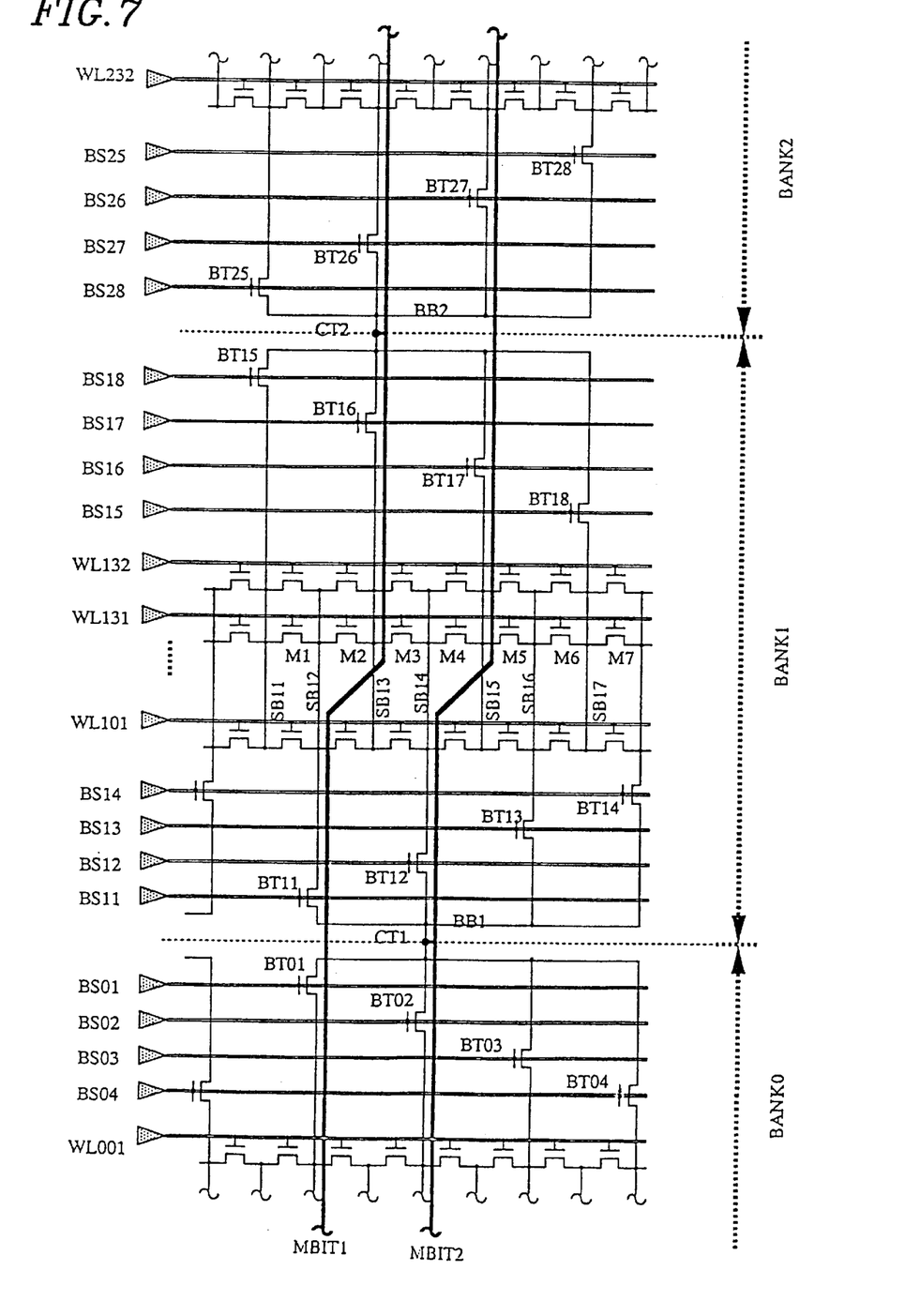
FIG. 7 is a diagram showing an equivalent circuit of the ROM of FIG. 5 for illustrating the problems raised in the case where the number of sub-bit lines connected to a main bit line is increased.

However, as shown in FIG. 7, in the case where the number of sub-bit lines connected to a single main bit line is increased in the above-mentioned conventional ROM, the number of bank selection lines in each bank is increased corresponding to the increase in the number of the sub-bit lines. As a result, the area of the memory cell array is disadvantageously increased.

SUMMARY OF THE INVENTION

According to one aspect of the present invention, a semiconductor memory device includes a plurality of main bit lines; a first bank having a plurality of memory cells, a plurality of word lines and a plurality of sub-bit lines; a second bank having a plurality of memory cells, a plurality of word lines and a plurality of sub-bit lines; an auxiliary conductive region connected to one of the plurality of main bit lines, the auxiliary conductive region being shared by the first bank and the second bank; a first bank selection transistor for selectively connecting one of the plurality of sub-bit lines of the first bank to the auxiliary conductive region; a second bank selection transistor for selectively connecting one of the plurality of sub-bit lines of the second bank to the auxiliary conductive region; and a first bank selection line shared by the first bank selection transistor and the second bank selection transistor.

In one example, the semiconductor memory device further includes a third bank selection transistor for selectively connecting one of the plurality of sub-bit lines of the first bank to the auxiliary conductive region; a fourth bank selection transistor for selectively connecting one of the plurality of sub-bit lines of the second bank to the auxiliary conductive region; and a second bank selection line shared by the third bank selection transistor and the fourth bank selection transistor.

In one example, the semiconductor memory device further includes a third bank selection transistor for selectively connecting one of the plurality of sub-bit lines of the first bank to the auxiliary conductive region; and a second bank selection line connected to the third bank selection transistor.

In one example, one of the plurality of sub-bit lines of the first bank is directly connected to one of the plurality of sub-bit lines of the second bank.

In one example, the semiconductor memory device is formed above a semiconductor substrate, the plurality of sub-bit lines of each of the first bank and the second bank are of a conductivity type opposite to a conductivity type of the semiconductor substrate, and the auxiliary conductive region is of a conductivity type opposite to the conductivity type of the semiconductor substrate.

In one example, the plurality of memory cells of the first bank are arranged in a matrix, and the plurality of memory cells of the second bank are arranged in a matrix.

In one example, the plurality of word lines of each of the first bank and the second bank intersect the plurality of sub-bit lines of each of the first bank and the second bank.

A semiconductor memory device according to the present invention includes a semiconductor substrate; a plurality of sub-bit lines provided in the column direction and arranged at prescribed intervals on a surface of the semiconductor substrate so as to be parallel to each other, the sub-bit lines being of a conductivity type which is opposite to a conductivity type of the semiconductor substrate; a memory cell array in which memory cell transistors each having its source and drain connected to the corresponding sub-bit lines are arranged in a matrix; a plurality of word lines provided in the row direction on the semiconductor substrate so as to intersect the sub-bit lines, the word lines being connected to the gates of the corresponding memory transistors; a plurality of auxiliary conductive regions formed in the vicinity of the ends of the corresponding sub-bit lines and being of the same conductivity type as the conductivity type of the sub-bit lines; bank selection transistors (i.e., bank cells) each located between an end of the corresponding sub-bit line and the corresponding auxiliary conductive region; a plurality of bank selection lines connected to the gates of the corresponding bank cells and provided substantially parallel to the word lines; and main bit lines provided on the corresponding sub-bit lines and auxiliary conductive regions and electrically connected to the corresponding auxiliary conductive regions, wherein bank regions are successively located adjacent to each other with a common auxiliary conductive region therebetween, and a bank selection line is shared by a pair of bank selection transistors located in two adjacent bank regions, respectively, and having a common auxiliary conductive region. Accordingly, the object of the present invention is achieved.

Preferably, a plurality of sub-bit lines are connected to a single auxiliary conductive region through the corresponding bank cells, and four sub-bit lines are connected to a single main bit line in each bank.

Preferably, among the plurality of sub-bit lines connected to the same auxiliary conductive region through the bank transistors, the outermost sub-bit lines in a bank are respectively connected to the outermost sub-bit lines in an adjacent bank at their ends, whereby the outermost sub-bit lines in the adjacent two banks share the corresponding bank cells.

Hereinafter, function of the present invention will be described.

In a ROM employing a hierarchical bit-line structure, a bank selection line is shared by a pair of bank cells located respectively in two adjacent bank regions, and having a common auxiliary conductive region. Accordingly, the number of bank selection lines can be reduced correspondingly. As a result, the number of main bit lines can be reduced, while preventing an increase in the area of the memory cell array.

Since the number of main bit lines can be reduced, the design rule for the main bit lines becomes less strict. Moreover, the area of a column selection circuit can be reduced. As a result, reduction in size of the ROM can be achieved.

Moreover, according to the present invention wherein four sub-bit lines are connected to a single main bit line in each bank, a uniform driving capability of the bank cells can be achieved, as well as the area of the memory cell array can be effectively reduced.

The reason for this is as follows: in order to improve the access time of the ROM, it is desirable to achieve the same access time regardless of the locations of the memory cells. In order to achieve the same access time, the same bit current must be applied to the memory cells being in the same state, regardless of the locations of the memory cells. Moreover, it is preferable that the bank cells have a uniform driving capability.

In order to achieve the uniform driving capability of the bank cells, it is effective to provide the bank cells such that the bank cells in a bank are arranged symmetrically with the bank cells in an adjacent bank. In order to achieve such symmetric arrangement of the bank cells, it is desirable to connect an even number of sub-bit lines to a single main bit line in each bank. It is most desirable to connect four sub-bit lines to a single main bit line in each bank. In this case, the area of the memory cell array can be effectively reduced, as well as the uniform driving capability of the bank cells can be achieved. However, the present invention is not limited to this, and an odd number of sub-bit lines may be connected to a single main bit line in each bank.

According to the present invention, among the plurality of sub-bit lines connected to the same auxiliary conductive region through the corresponding bank cells, the outermost sub-bit lines in a bank are respectively connected to the outermost sub-bit lines in an adjacent bank at their ends, whereby each pair of the connected outermost sub-bit lines in the adjacent two banks share a bank cell. In this case, the number of bank cells can be reduced, whereby the total area of the bank cells in the ROM can be reduced. As a result, the area of the memory cell array can further be reduced.

Thus, the invention described herein makes possible the advantage of providing a semiconductor memory device capable of reducing the number of main bit lines, thereby making the design rule for the main bit lines less strict, and also capable of reducing the area of a column selection circuit, and thus, reducing the area of a memory cell array.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. The same reference numerals and characters designate the same components.

(EXAMPLE 1

Figure 1:
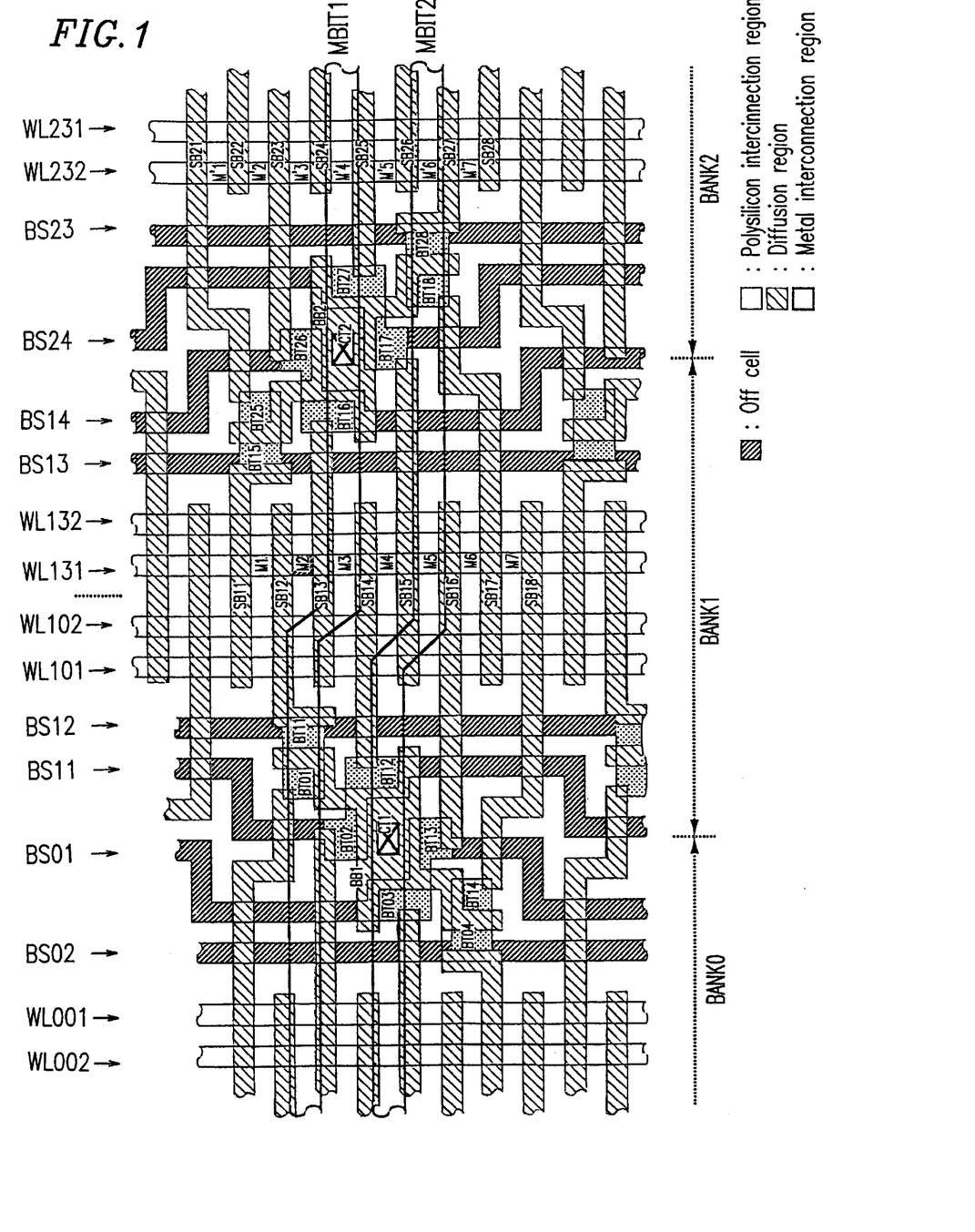
FIG. 1 is a diagram showing a partial layout pattern of a ROM employing a hierarchical bit-line structure according to Example 1 of the present invention.
Figure 2:
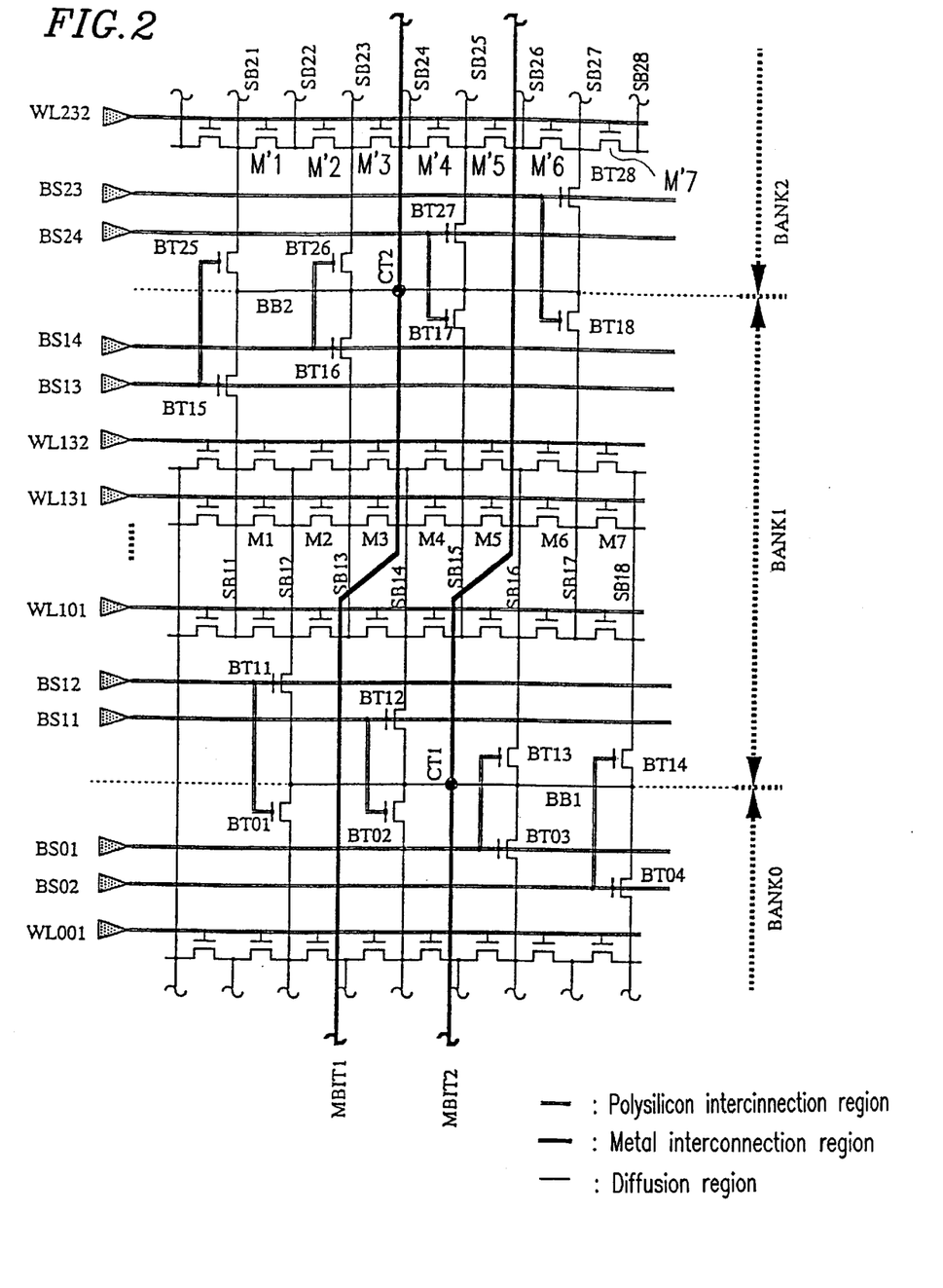
FIG. 2 is a diagram showing an equivalent circuit of the ROM of Example 1.

FIGS. 1 and 2 are diagrams showing a semiconductor memory device according to Example 1 of the present invention. FIG. 1 shows a partial layout pattern of a ROM employing a hierarchical bit-line structure, to which the present invention is applied, and FIG. 2 shows an equivalent circuit thereof.

According to Example 1, the ROM is provided above a $p^-$-type semiconductor substrate. A plurality of sub-bit lines SB11, SB12, . . . are provided in the column direction above the semiconductor substrate. The plurality of sub-bit lines are formed from an $N^+$-type diffusion layer. Thus, the conductivity type of the plurality of sub-bit lines is opposite to that of the semiconductor substrate. Moreover, a plurality of word lines WL001, WL102, . . . are provided in the row direction so as to intersect the plurality of sub-bit lines. The plurality of word lines are formed from polysilicon.

A memory cell (such as M1 to M7 and M'1 to M'7) is provided between every adjacent sub-bit lines. For example, the memory cell M1 is provided between the sub-bit lines SB11 and SB12. The word lines serve as the gate electrodes of the corresponding memory cells. Thus, the memory cells are arranged in a matrix on a prescribed region of the semiconductor substrate.

A plurality of auxiliary conductive regions BB1, BB2, ... are formed in the vicinity of the ends of the corresponding sub-bit lines. For example, the auxiliary conductive region BB2 is formed in the vicinity of the ends of the sub-bit lines SB11, SB13, SB15, SB17, SB21, SB23, SB25 and SB27. Each auxiliary conductive region is of the same conductivity type as that of the sub-bit lines.

Moreover, a plurality of bank selection transistors (i.e., bank cells) such as BT11, BT12, BT17 and BT18 are formed between each of the auxiliary conductive regions BB1 and BB2 and the sub-bit lines. For example, the bank cell BT11 is formed between the auxiliary conductive region BB1 and the bit line SB12. A plurality of bank selection lines such as BS11 to BS14 are formed in the row direction, and the bank selection lines serve as the gate electrodes of the corresponding bank cells. The plurality of bank selection lines are formed from polysilicon. A plurality of main bit lines MBIT1, MBIT2, ... are provided in the column direction as metal interconnections. The auxiliary conductive regions BB1 and BB2 are connected to the main bit lines MBIT2 and MBIT1 through contacts CT1 and CT2, respectively.

According to the ROM of Example 1, a plurality of banks BANK1, BANK2, ... are located adjacent to each other in the column direction with a common auxiliary conductive region therebetween. For example, a first bank BANK1 and a second bank BANK2 are located adjacent to each other in the column direction with the auxiliary conductive region BB2 therebetween.

The auxiliary conductive region BB2 is connected to the sub-bit lines SB11, SB13, SB15 and SB17 of the bank BANK1 through the bank cells BT15, BT16, BT17 and BT18, and is also connected to the sub-bit lines SB21, SB23, SB25 and SB27 of the bank BANK2 through the bank cells BT25, BT26, BT27 and BT28, respectively.

Thus, according to the ROM of Example 1, four sub-bit lines are connected to a single main bit line in each bank, and the bank selection lines are shared by every two adjacent banks. More specifically, the four sub-bit lines SB11, SB13, SB15 and SB17 of the bank BANX1 and the four sub-bit lines SB21, SB23, SB25 and SB27 of the bank BANK2 are connected to the main bit line MBIT1, and the bank selection lines BS13, BS14, BS23 and BS24 are shared by the banks BANK1 and BANK2.

Moreover, according to Example 1, the bank selection line BS13 serves as a common gate electrode of the bank cells BT15 and BT25. Similarly, the bank selection line BS14 serves as a common gate electrode of the bank cells BT16 and BT26, the bank selection line BS24 serves as a common gate electrode of the bank cells BT17 and BT27, and the bank selection line BS23 serves as a common gate electrode of the bank cells BT18 and BT28.

As described above, the ROM of Example 1 includes a plurality of main bit lines MBIT1, MBIT2, ... ; a plurality of banks BANK1, BANK2, ... each having a plurality of memory cells, a plurality of word lines and a plurality of sub-bit lines; and a plurality of auxiliary conductive regions BB1, BB2, ... each connected to a corresponding one of the plurality of main bit lines through a corresponding contact CT1, CT2, ... , and shared by the corresponding two banks which are adjacent to each other. For example, a first bank BANK1 has a plurality of memory cells M1 to M7, a plurality of word lines WL101 to WL132 and a plurality of sub-bit lines SB11 to SB18, and a second bank BANK2 has a plurality of memory cells M'1 to M'7, a plurality of word lines WL231, WL232, ... and a plurality of sub-bit lines SB21 to SB28. The auxiliary conductive region BB2 is connected to the main bit line MBIT1 through the contact CT2 and is shared by the first bank BANK1 and the second bank BANK2.

For example, the bank cells BT15 and BT25 have a common bank selection line BS13. Therefore, the bank cell BT15 electrically connects the sub-bit line SB11 to the auxiliary conductive region BB2 according to a potential at the bank selection line BS13, whereby the sub-bit line SB11 is electrically connected to the main bit line MBIT1 through the contact CT2. Similarly, the bank cell BT25 electrically connects the sub-bit line SB21 to the auxiliary conductive region BB2 according to a potential at the bank selection line BS13, whereby the sub-bit line SB21 is electrically connected to the main bit line MBIT1 through the contact CT2. Since the bank selection line BS13 is shared by the bank cells BT15 and BT25, the number of bank selection lines can be reduced as compared to the conventional ROM of FIG. 5. As a result, the number of main bit lines can be reduced by half with respect to the conventional ROM of FIG. 5, while preventing an increase in the area of the memory cell array.

Thus, according to Example 1, four sub-bit lines are connected to a single main bit line in each bank. As a result, the number of main bit lines can be reduced by half as compared to the above-mentioned conventional ROM in which two sub-bit lines are connected to a single main bit line in each bank.

It should be noted that, in order to improve the access time of the ROM of Example 1, it is desirable to achieve the same access time regardless of the locations of the memory cells. In order to achieve the same access time, the same bit current must be applied to the memory cells being in the same state, regardless of the locations of the memory cells. Moreover, it is preferable that the bank cells have a uniform driving capability.

In order to achieve the uniform driving capability of the bank cells, it is effective to provide the bank cells such that the bank cells in a bank are arranged symmetrically with the bank cells in an adjacent bank. In order to achieve such symmetric arrangement of the bank cells, it is desirable to connect an even number of sub-bit lines to a single main bit line in each bank. It is most desirable to connect four sub-bit lines to a single main bit line in each bank, as in the case of Example 1.

This is because the area of the memory cell array can be effectively reduced, as well as the uniform driving capability of the bank cells can be achieved.

Moreover, the number of main bit lines can be reduced, whereby the design rule for the main bit lines becomes less strict. Furthermore, the area of a column selection circuit (not shown) can be reduced. As a result, reduction in size of the ROM can be achieved.

EXAMPLE 2

Figure 3:
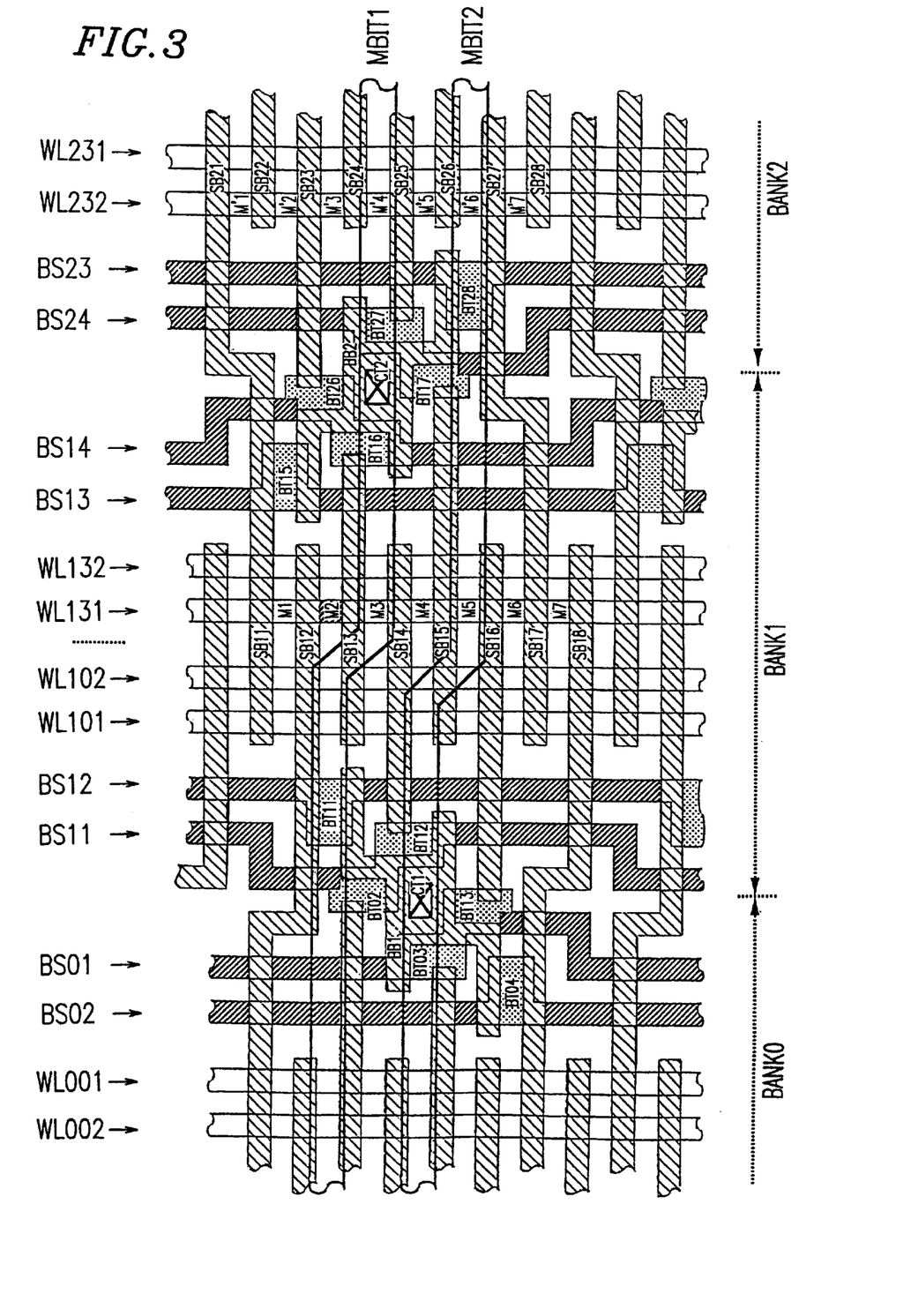
FIG. 3 is a diagram showing a partial layout pattern of a ROM employing a hierarchical bit-line structure according to Example 2 of the present invention.
Figure 4:
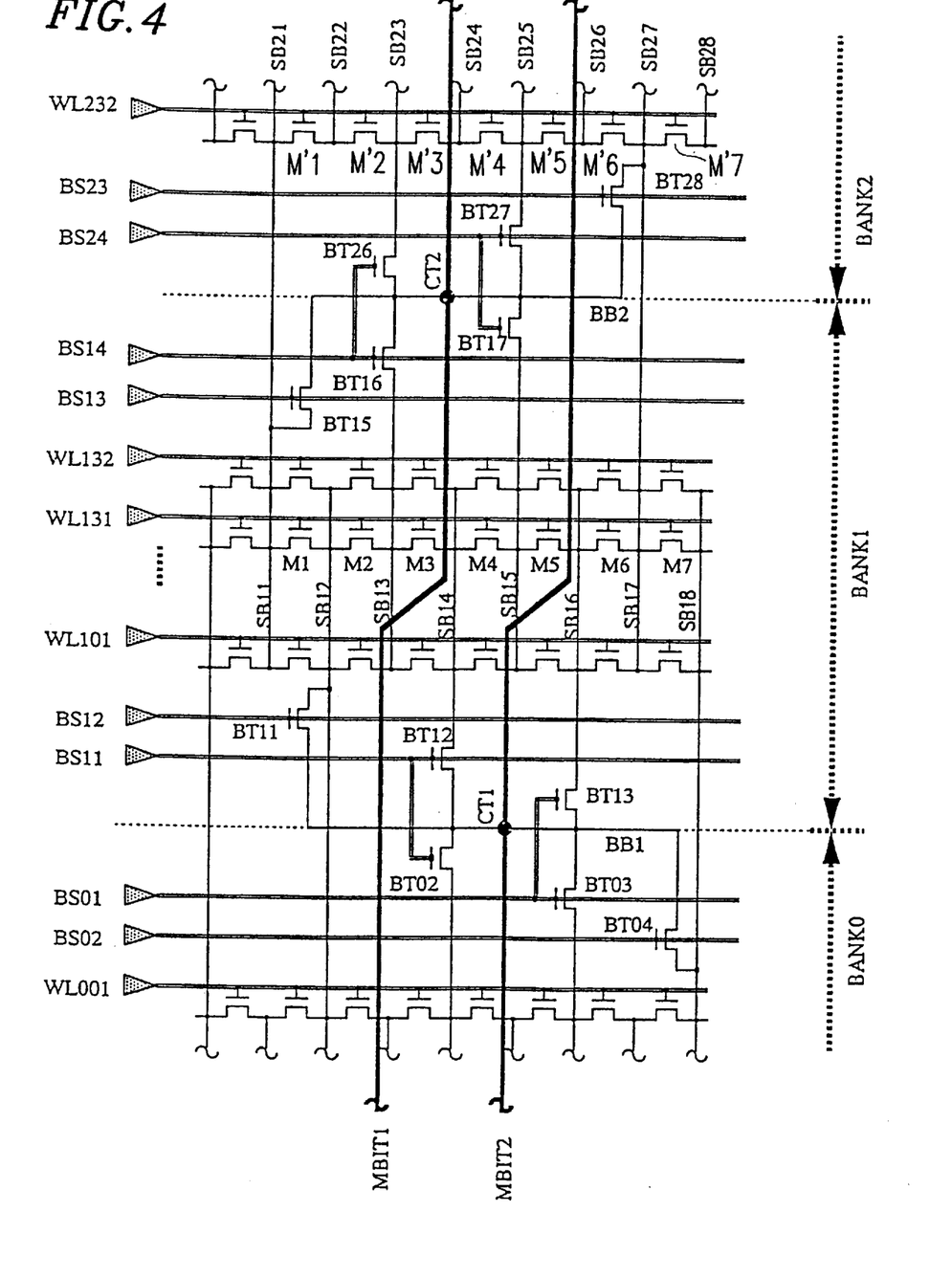
FIG. 4 is a diagram showing an equivalent circuit of the ROM of Example 2.

FIGS. 3 and 4 are diagrams showing a semiconductor memory device according to Example 2 of the present invention. FIG. 3 shows a partial layout pattern of a ROM having a hierarchical bit-line structure, to which the present invention is applied, and FIG. 4 shows an equivalent circuit thereof.

The ROM of Example 2 is different from the ROM of Example 1 in that, among a plurality of sub-bit lines connected to the same auxiliary conductive region, the outermost sub-bit lines in a bank are respectively connected to the outermost sub-bit lines in an adjacent bank. As a result, each pair of the connected outermost sub-bit lines in the adjacent two banks share a bank cell. More specifically, among the plurality of sub-bit lines SB11, SB13, SB15, SB17, SB21, SB23, SB25 and SB27 which are connected to the auxiliary conductive region BB2, the outermost sub-bit line SB11 in the bank BANK1 is connected to the outermost sub-bit line SB21 in the bank BANK2. Similarly, the outermost sub-bit line SB17 in the bank BANK1 is connected to the outermost sub-bit line SB27 in the bank BANK2. As a result, the connected sub-bit lines SB11 and SB21 share the bank transistor BT15, whereas the connected sub-bit lines SB17 and SB27 share the bank transistor BT28.

The ROM of Example 2 includes a plurality of main bit lines MBIT1, MBIT2, . . . ; a plurality of banks BANK1, BANK2, . . . each having a plurality of memory cells, plurality of word lines and a plurality of sub-bit lines; a plurality of auxiliary conductive regions BB1, BB2, . . . each connected to a corresponding one of the plurality of main bit lines through a corresponding contact CT1, CT2, . . . , and shared by corresponding two banks which are adjacent to each other. For example, a first bank BANK1 has a plurality of memory cells M1 to M7, a plurality of word lines WL101 to WL132 and a plurality of sub-bit lines SB11 to SB18. Similarly, a second bank BANK2 has a plurality of memory cells M'1 to M'7, a plurality of word lines WL231, WL232, . . . and a plurality of sub-bit lines SB21 to SB28. The auxiliary conductive region BB2 is connected to the main bit line MBIT1 through the contact CT2, and is shared by the first bank BANK1 and the second bank BANK2.

The ROM of Example 2 further includes first to third bank selection transistors (i.e., bank cells) BT16, BT26 and BT15. The first bank cell BT16 selectively connects one sub-bit line SB13 of the plurality of sub-bit lines SB11 to SB17 in the first bank BANK1 to the auxiliary conductive region BB2 through the contact CT2. The second bank cell BT26 selectively connects one sub-bit line SB23 of the plurality of sub-bit lines SB21 to SB27 in the second bank BANK2 to the auxiliary conductive region BB2 through the contact CT2. The third bank cell BT15 selectively connects two sub-bit lines SB11 and SB21 of the plurality of sub-bit lines SB11 to SB17 and SB21 to SB27 in the first and second banks BANK1 and BANK2 to the auxiliary conductive region BB2 through the contact CT2. It should be noted that the sub-bit line SB11 of the first bank BANK1 is connected to the sub-bit line SB21 of the second bank BANK2.

With such a structure as described above, the number of bank cells can be reduced. In other words, the total area of the bank cells in the ROM can be reduced. Accordingly, the area of the memory cell array can further be reduced as compared to Example 1.

OTHER EXAMPLES

In Examples 1 and 2, the present invention is applied to a mask ROM which is programmed by ion implantation. However, the present invention can be widely applied to non-volatile memories employing a hierarchical bit-line structure. For example, the present invention can be applied to other mask ROMs and EEPROMs.

Moreover, according to Examples 1 and 2, the word lines and bank selection lines are formed from polysilicon. However, the present invention is not limited to this, and the word lines and bank selection lines may alternatively be formed from polycide, silicide or the like.

According to the semiconductor memory device of the present invention, which is applied to the ROM employing a hierarchical bit-line structure, a bank selection line is shared by a pair of bank cells located in two adjacent bank regions, respectively, and having a common auxiliary conductive region. Accordingly, the number of bank selection lines can be reduced correspondingly. As a result, the number of main bit lines can be reduced, while preventing an increase in the area of the memory cell array.

Since the number of main bit lines can be reduced, the design rule for the main bit lines becomes less strict. Moreover, the area of a column selection circuit (not shown) can be reduced. As a result, reduction in size of the ROM can be achieved.

In particular, in the semiconductor memory device according to the present invention, four sub-bit lines are connected to a single main bit line in each bank. Accordingly, the area of the memory cell array can be effectively reduced, as well as a uniform driving capability of the bank cells can be achieved.

Moreover, in the semiconductor memory device according to the present invention, among the plurality of sub-bit lines connected to the same auxiliary conductive region through the corresponding bank cells, the outermost sub-bit lines in a bank are respectively connected to the outermost sub-bit lines in an adjacent bank at their ends. Thus, each pair of the connected outermost sub-bit lines in the adjacent two banks share a bank cell, whereby the number of bank cells can be reduced. Accordingly, the total area of the bank cells in the ROM can be reduced, whereby the area of the memory cell array can further be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a plurality of main bit lines;
   a first bank having a plurality of memory cells, a plurality of word lines and a plurality of sub-bit lines;
   a second bank having a plurality of memory cells, a plurality of word lines and a plurality of sub-bit lines;
   an auxiliary conductive region connected to one of the plurality of main bit lines, the auxiliary conductive region being shared by the first bank and the second bank;
   a first bank selection transistor for selectively connecting one of the plurality of sub-bit lines of the first bank to the auxiliary conductive region;
   a second bank selection transistor for selectively connecting one of the plurality of sub-bit lines of the second bank to the auxiliary conductive region; and
   a first bank selection line shared by the first bank selection transistor and the second bank selection transistor.

2. A semiconductor memory device according to claim 1, further comprising:
   a third bank selection transistor for selectively connecting one of the plurality of sub-bit lines of the first bank to the auxiliary conductive region;
   a fourth bank selection transistor for selectively connecting one of the plurality of sub-bit lines of the second bank to the auxiliary conductive region; and
   a second bank selection line shared by the third bank selection transistor and the fourth bank selection transistor.

3. A semiconductor memory device according to claim 1, further comprising:

a third bank selection transistor for selectively connecting one of the plurality of sub-bit lines of the first bank to the auxiliary conductive region; and a second bank selection line connected to the third bank selection transistor.

4. A semiconductor memory device according to claim 1, wherein one of the plurality of sub-bit lines of the first bank is directly connected to one of the plurality of sub-bit lines of the second bank.

5. A semiconductor memory device according to claim 1, wherein the semiconductor memory device is formed above a semiconductor substrate, the plurality of sub-bit lines of each of the first bank and the second bank are of a conductivity type opposite to a conductivity type of the semiconductor substrate, and the auxiliary conductive region is of a conductivity type opposite to the conductivity type of the semiconductor substrate.

6. A semiconductor memory device according to claim 1, wherein the plurality of memory cells of the first bank are arranged in a matrix, and the plurality of memory cells of the second bank are arranged in a matrix.

7. A semiconductor memory device according to claim 1, wherein the plurality of word lines of each of the first bank and the second bank intersect the plurality of sub-bit lines of each of the first bank and the second bank.

* * * * *